Figure 1:
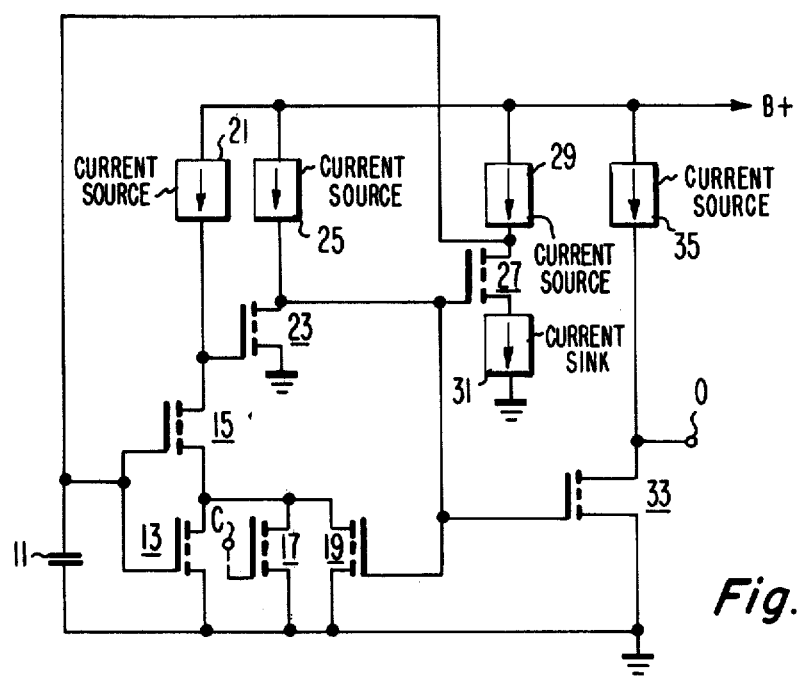

United States Patent [19]

Astle

[11] 4,263,567
[45] Apr. 21, 1981

[54] VOLTAGE CONTROLLED OSCILLATOR

[75] Inventor: Brian Astle, Princeton, N.J.

[73] Assignee: RCA Corporation, New York, N.Y.

[21] Appl. No.: 38,078

[22] Filed: May 11, 1979

[51] Int. Cl.³ .................................................. H03K 3/282
[52] U.S. Cl. ...................................... 331/111; 331/57
[58] Field of Search ............... 331/111, 107 R, 110, 331/113, 108 D

[56] References Cited

U.S. PATENT DOCUMENTS

| | | | |
|---|---|---|---|
| 3,702,446 | 11/1972 | Steudel | 331/111 |
| 3,803,516 | 4/1974 | Wilcox | 331/111 |
| 3,831,113 | 8/1974 | Ahmed | 331/111 |
| 3,946,330 | 3/1976 | Takahashi | 331/111 |
| 4,072,910 | 2/1978 | Dingwall et al. | 331/57 |

*Primary Examiner*—David K. Moore
*Attorney, Agent, or Firm*—Eugene M. Whitacre; William H. Meagher

[57] ABSTRACT

In a VCO, the switching of capacitor charge control circuits between capacitor charging and discharging states is rendered responsive to the current demand of a first FET monitoring the potential across the capacitor. The source-drain path of a second FET, variable in conductivity in response to an external frequency control signal, is connected in the source circuit of the first FET, in parallel with the source-drain path of a third FET. The third FET is non-conductive during operation in the capacitor charging state, but is strongly conductive during operation in the capacitor discharging state. As a consequence, the threshold potential at which switching to the capacitor discharging state occurs varies in accordance with the control signal, while the threshold potential at which switching to the capacitor charging state occurs does not so vary.

5 Claims, 2 Drawing Figures

VOLTAGE CONTROLLED OSCILLATOR

The present invention relates generally to a voltage controlled oscillator (VCO), and particularly to a voltage controlled relaxation oscillator of a novel and advantageous form permitting frequency control without disturbance of output duty cycle over a wide range of operating temperatures.

In an illustrative color television receiver application of the invention, a relaxation oscillator constructed pursuant to the principles of the present invention serves as the VCO in a frequency tripler of the phase-locked loop (PLL) type, deriving from reference signals of color subcarrier frequency ($f_{sc}$=3.579545 MHz.) clock control signals of a 3 $f_{sc}$ frequency (10.738635 MHz.) for use in clocking the charge transfers in CCD comb filter circuits of the type shown in U.S. Pat. No. 4,096,516 - Pritchard. In this illustrative application, the oscillator circuitry is subject to realization in integrated circuit form, using N-MOS technology, on a common monolithic integrated circuit chip with the clocked CCD elements. For proper PLL operation in maintaining an accurate clocking frequency, it is desirable that, under the various temperature conditions encountered in receiver operation, frequency control of the VCO in response to control voltage variations does not introduce output duty cycle variations.

In accordance with the principles of the present invention, a relaxation oscillator, in which the potential across a capacitor, subject alternately to charging and discharging, is ramped up and down between an upper threshold potential and a lower threshold potential, is provided with a frequency control arrangement in which one of the threshold potentials, to the effective exclusion of the other, is subject to variation in response to an external frequency control voltage.

In an illustrative embodiment of the present invention, the switching of the capacitor charge control circuits between capacitor charging and discharging states is rendered responsive to the current demand of a transistor device monitoring the potential across the capacitor. Variable impedance means, associated with the transistor device in a manner influencing the current demand thereof, are rendered responsive to the external frequency control signal, and to the state of operation of the charge control circuits, so as to exhibit: (1) an impedance of a value which is variable over a given range of values in dependence upon the magnitude of the external control signal, when the charge control circuits operate in a given one of said operating states; and (2) an impedance of a substantially constant value, less than said given range of values and substantially independent of the magnitude of the external control signal, when the charge control circuits operate in the other of said operating states. As a consequence of such relationships, the threshold potential at which said one operating state is terminated varies in accordance with the external control signal, whereas the threshold potential at which the other operating state is terminated is substantially unaffected by said external control signal. With the ramping rates unaffected by the external control signal, the effect of variations of the one threshold potential is a change in oscillator frequency without change of duty cycle.

Illustratively, the variable impedance means comprises a pair of transistor devices with conduction paths paralleled in the source circuit of a field effect transistor serving the capacitor potential monitoring function. The conductivity of a first of the conduction paths varies with the external control signal. The second conduction path is non-conductive during said one operating state, but is strongly conductive during said other operating state, effectively short-circuiting said first conductive path.

Figure 2:
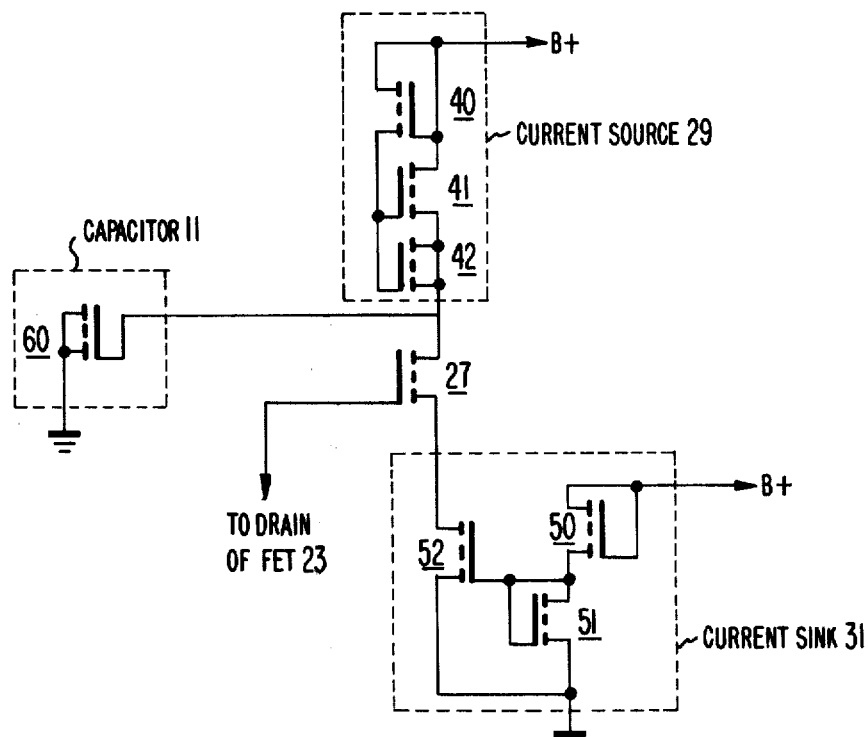

In the accompanying drawings:

FIG. 1 illustrates, partially schematically and partially by block representation, a voltage controlled oscillator embodying the principles of the present invention; and FIG. 2 illustrates schematically circuitry for implementing particular functions of the oscillator arrangement of FIG. 1.

In FIG. 1, a capacitor 11 is coupled between the gate and source electrodes of a field effect transistor 13. The source electrode of transistor 13 is directly connected to a point of reference potential (shown as ground). The drain electrode of transistor 13 is connected to the source electrode of a field effect transistor 15, the gate electrode of which is connected to the gate electrode of transistor 13.

The controlled conduction path between source and drain electrodes of transistor 13 is shunted by the parallel combination of the controlled conduction paths of field effect transistors 17 and 19, with the source electrodes of the latter transistors grounded and the drain electrodes thereof connected to the drain electrode of transistor 13. The gate electrode of transistor 17 is connected to frequency control voltage input terminal C.

The drain electrode of transistor 15 is connected to the gate electrode of a field effect transistor 23, the source electrode of which is grounded. The drain electrode of transistor 23 is connected to the gate electrode of the aforementioned transistor 19, and to the gate electrodes of additional field effect transistors 27 and 33.

The source electrode of transistor 33 is grounded, and the drain electrode thereof is connected to the oscillator output terminal 0. The source electrode of transistor 27 is coupled to ground via a current sink 31, and the drain electrode thereof is connected to the junction of capacitor 11 and the gate electrodes of transistors 13 and 15. Respective current sources 31, 25, 29 and 35 are coupled between a positive operating potential supply terminal (B+) and the drain electrodes of transistors 15, 23, 27 and 33, respectively. The current demand of current sink 31 exceeds the current available from current supply 29, and is illustratively twice as large.

For an initial explanation of the operation of the oscillator arrangement of FIG. 1, the impact of transistor 17 (to which the frequency control voltage is applied) will be neglected. As a point of departure for the description of the circuit operation, it shall be assumed that capacitor 11 is discharged, wherefore transistors 13 and 15 are in a high impedance, non-conductive state. Under these circumstances, transistor 23 is biased to be strongly conductive, holding transistors 19, 27 and 33 off. With transistor 33 off, the potential at output terminal 0 is high. With transistor 27 off, current sink 31 is decoupled from capacitor 11, and the current supplied by source 29 is available for charging capacitor 11.

As charging of capacitor 11 continues, the potential at the gates of transistors 13 and 15 rises, increasing the current demand of the drain of transistor 15. When this current demand exceeds a threshold current value (the available supply from current source 21), the potential at the gate of transistor 23 drops, causing a rise in potential at the drain of transistor 23, initiating conduction in transistors 19, 27, and 33.

Conduction in transistor 19, dropping from its high impedance state, has a regenerative effect, further increasing the current demand of transistor 15, whereby transistor 23 rapidly switches off and transistors 19, 27 and 33 rapidly become strongly conductive. The potential at output terminal 0 goes low, and the strongly conducting transistor 27 couples current sink 31 across capacitor 11. With the current demand of current sink 31 exceeding the available supply from source 29, discharging of capacitor 11 now commences. With the illustrative ratio of 2:1 between the current demand of current sink 31 and the current supply by current source 29, the capacitor discharging rate is directly comparable to the prior charging rate.

With strongly conducting transistor 19 contributing to determination of the current demand of transistor 15 during circuit operation in the capacitor discharging state, the current demand of transistor 15 does not drop below the aforementioned threshold current value until the potential at the gates of transistors 13 and 15 is at a different, lower potential (lower threshold potential) than the potential (upper threshold potential) at which the switching into the discharging state was initiated. When the lower threshold potential is reached, however, a rise in the gate potential of transistor 23 occurs, causing a lessening of conduction by transistors 19, 27, and 33. The rise in impedance of transistor 19 has a regenerative effect, further reducing the current demand of transistor 15, and transistor 23 rapidly becoming strongly conductive while transistors 19, 27 and 33 rapidly switch off. The potential at output terminal 0 returns high, and a new cycle of oscillation is commenced.

It is now in order to consider the effect of transistor 17. The conduction path between the source and drain electrodes of transistor 17 parallels the conduction paths of transistors 13 and 19 in return of the source electrode of transistor 15 to ground. When the oscillator circuits are operating in the capacitor charging state, with transistor 19 non-conductive, the conductivity of the conductive path of transistor 17, as determined by the magnitude of control voltage applied to terminal C, can significantly influence the current demand of transistor 15. Thus, variations of the control voltage will alter the upper threshold potential—the potential at which a rising current demand of transistor 15 reaches the threshold current value to cause switching into the capacitor discharging state.

In contrast, when the oscillator circuits are operating in the capacitor discharging state, transistor 19 is strongly conducting, effectively shorting the source of transistor 15 to ground. Under these circumstances, variations in the conductivity of transistor 17 cannot significantly influence the current demand of transistor 15. Thus, the lower threshold potential—the potential at which a falling current demand of transistor 15 reaches the threshold current value to cause switching into the capacitor charging state—is essentially unaffected by the magnitude of the control voltage applied to terminal C.

When the control voltage at terminal C shifts more positive to increase the conductivity of the conduction path of transistor 17, the upper threshold potential is lowered, while the lower threshold potential is substantially undisturbed, with the result that the oscillator frequency increases. An opposite direction shift in the control voltage raises the upper threshold potential without significantly affecting the lower threshold potential, wherefore the oscillator frequency decreases. With the control voltage changes having no effect on the magnitudes of the current supplied by source 29 or the current demand of current sink 31, and thus no effect on the charging and discharging rates, the frequency changes do not disturb the constancy of the output duty cycle which is determined by the ratio of said current magnitudes. With employment of appropriate integrated circuit techniques in realization of the current source 29 and the current sink 31, this ratio can be held substantially constant in the face of operating temperature variations.

FIG. 2 schematically illustrates circuit details of an illustrative integrated circuit implementation of the current source (29), current sink (31), and capacitor (11) elements associated with transistor 27 in the oscillator of FIG. 1. The additional current source elements (21, 25 and 35) of the FIG. 1 are also illustratively subject to implementation in the manner illustrated for current source 29 in FIG. 2.

As shown in FIG. 2, the current source 29 comprises a trio of FET devices (40, 41, 42) interconnected in a well-known circuit configuration. The controlled conduction path between the drain and source electrodes of device 41 provides a current supply path between the B+ terminal and the drain electrode of transistor 27. Device 42, with its gate electrode connected to the gate electrode of device 41, and its source and drain electrodes connected in common to the source electrode of device 41, serves as a bootstrapping capacitance across the gate and source electrodes of supply transistor 41. Device 40, with its drain and gate electrodes connected in common to the B+ terminal, and its source electrode connected to the gate electrode of supply transistor 41, serves as a non-linear resistance with diode-like characteristics for biasing the gate electrode of the supply transistor 41.

As shown in FIG. 2, current sink 31 comprises a trio of FET devices (50, 51, 52) interconnected in a well-known current mirror configuration. The controlled conduction path between the drain and source electrodes of transistor 52 provides a current sink path between the source electrode of transistor 27 and ground. The current demand of the drain of transistor 52 is controlled by the current flowing in the drain-source path of device 51 which is coupled across the gate and source electrodes of device 52, via the common connection of the gate and drain electrodes of device 51 to the gate electrode of device 52, and the grounding of the source electrode of device 51. A current source for the drain electrode of device 51 is provided by device 50, with its gate and drain electrodes connected in common to the B+ terminal, and its source electrode connected to the drain electrode of device 51.

The function of capacitor 11 is implemented in FIG. 2 by an additional FET device 60. The gate electrode of device 60 serves as one plate of capacitor 11, and is connected to the drain electrode of transistor 27. The grounded plate of capacitor 11 is formed by the interconnected source and drain electrodes of device 60.

What is claimed is:
1. A relaxation oscillator subject to frequency control in response to an external control signal, comprising:
first and second transistors, each having first and second electrodes with a controlled conduction path therebetween and having a control electrode, the conductivity of the controlled conduction path of each transistor being subject to variation in response to variations of the potential between its second and control electrodes; the first electrode of said first transistor being connected to the second electrode of said second transistor;

a capacitance coupled between said second electrode of said first transistor and the control electrodes of both of said transistors;

charge control means coupled to the first electrode of the second transistor and responsive to the current demand of said second transistor for (a) operating in a first state to effect charging of said capacitance whenever said current demand lies below a threshold level, and (b) operating in a second state to effect discharging of said capacitance whenever said current demand exceeds said threshold level;

variable impedance means, responsive to said external control signal and to the state of operation of said charge control means, for exhibiting:

(1) an impedance of a value which is variable over a given range of values in dependence upon the magnitude of said external control signal, when said charge control means operates in a given one of said operating states; and (2) an impedance of a substantially constant value, less than said given range of values and substantially independent of magnitude of said external control signal, when said charge control means operates in the other of said operating states; and means for coupling said variable impedance means in shunt with the controlled conduction path of said first transistor.

2. Apparatus in accordance with claim 1, wherein said variable impedance means comprises:

third and fourth transistors, each having first and second electrodes with a controlled conduction path therebetween and having a control electrode, the conductivity of the controlled conduction path of each transistor being subject to variation in response to variations of the potential between its second and control electrodes; the controlled conduction path of said third transistor being coupled in parallel with the controlled conduction path of said fourth transistor;

means for applying said external control signal to the control electrode of said third transistor; and means for coupling the control electrode of said fourth transistor to said charge control means in such manner that the controlled conduction path of said fourth transistor is rendered (a) non-conductive when said charge control means operates in said given one of said operating states and (b) strongly conductive when said charge control means operates in said other of said operating states; and wherein said first-named coupling means couples the parallel combination of the controlled conduction paths of said third and fourth transistors in shunt with the controlled conduction path of said first transistor.

3. Apparatus in accordance with claim 2, wherein said charge control means includes:

a source of current of a given magnitude coupled to said capacitance;

a current sink exhibiting a current demand of a greater magnitude than said given magnitude;

switching means for coupling said current sink across said capacitance when in a first switching state and for decoupling said current sink from said capacitance when in a second switching state;

a fifth transistor, having first and second electrodes with a controlled conduction path therebetween and having a control electrode, the conductivity of the controlled conduction path of said fifth transistor being subject to variation in response to variations of the potential between its second and control electrodes;

means, including a coupling between the control electrode of said fifth transistor and the first electrode of said second transistor, and a coupling between the second electrode of said fifth transistor and the second electrode of said first transistor, for rendering the controlled conduction path of said fifth transistor strongly conductive when said current demand of said second transistor lies below said threshold level, and substantially non-conductive when said current demand of said second transistor exceeds said threshold level; and means, responsive to the potential at the first electrode of said fifth transistor, for causing said switching means to occupy said first switching state only when the controlled conduction path of said fifth transistor is substantially non-conductive.

4. Apparatus in accordance with claim 3, wherein said second-named coupling means comprises a coupling between said first electrode of said fifth transistor and said control electrode of said fourth transistor.

5. Apparatus in accordance with claim 4, also including means, responsive to the potential at said first electrode of said fifth transistor, for developing oscillatory output waves, of a frequency dependent upon the magnitude of said external control signal, and of a duty cycle dependent upon the ratio of said given and greater current magnitudes and substantially independent of the magnitude of said external control signal.

* * * * *